(12) United States Patent
Ning et al.

(10) Patent No.: US 12,354,941 B2
(45) Date of Patent: Jul. 8, 2025

(54) CHIP PACKAGE STRUCTURE AND STORAGE SYSTEM

(71) Applicant: CHANGXIN MEMORY TECHNOLOGIES, INC., Hefei (CN)

(72) Inventors: Shu-Liang Ning, Hefei (CN); Jun He, Hefei (CN); Jie Liu, Hefei (CN); Zhan Ying, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 463 days.

(21) Appl. No.: 17/844,200

(22) Filed: Jun. 20, 2022

(65) Prior Publication Data

US 2023/0223326 A1 Jul. 13, 2023

Related U.S. Application Data

(63) Continuation of application No. PCT/CN2022/082017, filed on Mar. 21, 2022.

(30) Foreign Application Priority Data

Jan. 13, 2022 (CN) .................. 202210038562.X (51) Int. Cl.
*H01L 23/498* (2006.01)
*H01L 23/00* (2006.01)
(Continued)

(52) U.S. Cl.
CPC .. *H01L 23/49838* (2013.01); *H01L 23/49822* (2013.01); *H01L 24/08* (2013.01); *H01L 24/16* (2013.01); *H01L 25/0652* (2013.01); *H01L 23/481* (2013.01); *H01L 24/09* (2013.01); *H01L 24/13* (2013.01); *H01L 24/80* (2013.01); *H01L 24/81* (2013.01); *H01L 2224/0801* (2013.01); *H01L 2224/08148* (2013.01); *H01L 2224/0913* (2013.01); *H01L 2224/13147* (2013.01); *H01L 2224/16148* (2013.01);
(Continued)

(58) Field of Classification Search
None
See application file for complete search history.

(56) References Cited

U.S. PATENT DOCUMENTS 9,917,026 B2 * 3/2018 Oikawa ............. H01L 23/49811
10,586,775 B2 3/2020 Kim
(Continued)

FOREIGN PATENT DOCUMENTS

CN 107768344 A 3/2018
CN 109524377 A 3/2019
(Continued)

*Primary Examiner* — Hung K Vu
(74) *Attorney, Agent, or Firm* — Syncoda LLC; Feng Ma (57) ABSTRACT

A chip package structure and a storage system are provided. The chip package structure includes a chipset, a first Re-Distribution Layer (RDL), and a bonding pad region. The chipset includes a plurality of chips distributed horizontally. The first RDL is disposed on a first surface of the chipset. The bonding pad region includes a plurality of bonding pads, the plurality of bonding pads are located on a side surface of the first RDL away from the chipset, and the plurality of bonding pads are connected to the plurality of chips through the first RDL.

15 Claims, 13 Drawing Sheets (51) Int. Cl.
*H01L 25/065* (2023.01)
*H01L 23/48* (2006.01)

(52) U.S. Cl.
CPC ............... *H01L 2224/80895* (2013.01); *H01L 2224/81203* (2013.01); *H01L 2924/1431* (2013.01); *H01L 2924/1432* (2013.01); *H01L 2924/1436* (2013.01); *H01L 2924/1437* (2013.01)

(56) References Cited

U.S. PATENT DOCUMENTS

| | | |
|---|---|---|
| 10,916,497 B2 | 2/2021 | Ishihara |
| 2002/0063262 A1 | 5/2002 | Matsuzaki |
| 2004/0188718 A1 | 9/2004 | Matsuzaki |
| 2005/0218432 A1 | 10/2005 | Matsuzaki |
| 2008/0142847 A1 | 6/2008 | Matsuzaki |
| 2014/0001639 A1* | 1/2014 | Hiraishi ............... H01L 25/0652 257/773 |
| 2019/0229076 A1 | 7/2019 | Kim et al. |
| 2019/0244945 A1 | 8/2019 | Kim |
| 2020/0105661 A1 | 4/2020 | Ishihara et al. |
| 2020/0312772 A1* | 10/2020 | Xi ......................... H01L 23/564 |
| 2021/0175162 A1* | 6/2021 | Yazdani .................. H01L 21/52 |
| 2021/0257291 A1 | 8/2021 | Ishihara et al. |

FOREIGN PATENT DOCUMENTS

| | | |
|---|---|---|
| CN | 109994438 A | 7/2019 |
| CN | 110071101 A | 7/2019 |
| CN | 110957313 A | 4/2020 |
| CN | 111819689 A | 10/2020 |
| CN | 211980611 U | 11/2020 |
| WO | 2021159961 A1 | 8/2021 |

* cited by examiner

CHIP PACKAGE STRUCTURE AND STORAGE SYSTEM

CROSS-REFERENCE TO RELATED APPLICATIONS

The disclosure is a continuation application of International Patent Application No. PCT/CN2022/082017, filed on Mar. 21, 2022, which is filed based upon and claims priority to Chinese patent application No. 202210038562.X, filed on Jan. 13, 2022 and entitled "CHIP PACKAGE STRUCTURE AND STORAGE SYSTEM". The contents of International Patent Application No. PCT/CN2022/082017 and Chinese Patent Application No. 202210038562.X are hereby incorporated by reference in their entireties.

BACKGROUND

With the continuous development of semiconductor technology, the number of electronic components in integrated circuits is increasing, and the internal structures of the integrated circuits are becoming more and more complex, which brings more challenges to the design and processing of integrated circuits, and requires more optimized structures.

A chiplet is a multi-functional heterogeneous System in Packages (SIP) chip mode, in which a plurality of module chips are packaged together by an underlying base chip through internal interconnection technology. A Re-Distribution Layer (RDL) may then extend bonding pads and change the layout of the bonding pads to adapt to the requirements of chip design.

SUMMARY

The disclosure relates to, but is not limited to, a chip package structure and a storage system.

Embodiments of the disclosure are expected to provide a chip package structure and a method for manufacturing a chip package structure.

The technical solutions of the disclosure are implemented as follows.

The embodiments of the disclosure provide a chip package structure. The chip package structure includes a chipset, a first Re-Distribution Layer (RDL), and a bonding pad region.

The chipset includes a plurality of chips distributed horizontally.

The first RDL is disposed on a first surface of the chipset.

The bonding pad region includes a plurality of bonding pads, the plurality of bonding pads are located on a side surface of the first RDL away from the chipset, and the plurality of bonding pads are connected to the plurality of chips through the first RDL.

The embodiments of the disclosure also provide a storage system. The storage system includes a first storage module. The first storage module includes the chip package structure in the above-mentioned solution.

DETAILED DESCRIPTION

In order to make the objectives, technical solutions, and advantages of the disclosure clearer, the technical solutions of the disclosure will further be described below in combination with the drawings and embodiments in detail. The described embodiments should not be considered as a limitation to the disclosure. All other embodiments obtained by those of ordinary skill in the art without creative work shall fall within the scope of protection of the disclosure.

"Some embodiments" involved in the following descriptions describes a subset of all possible embodiments. However, it can be understood that "some embodiments" may be the same subset or different subsets of all the possible embodiments, and may be combined without conflicts.

If the similar descriptions of "first/second" appear in the disclosed documents, the following descriptions will be added. Terms "first/second/third" involved in the following descriptions are only for distinguishing similar objects and do not represent a specific sequence of the objects. It can be understood that "first/second/third" may be interchanged to specific sequences or orders if allowed to implement the embodiments of the disclosure described herein in sequences except the illustrated or described ones.

Unless otherwise defined, all technological and scientific terms used in the disclosure have meanings the same as those usually understood by those skilled in the art of the disclosure. The terms used in the disclosure are only adopted to describe the embodiments of the disclosure and not intended to limit the disclosure.

A chiplet is an integration system that contains a plurality of chips with different functions. A plurality of chiplets are integrated with a Printed Circuit Board (PCB) to enable a host architecture to execute higher computing power. In a related art, memory structures and storage system structures contained in the chiplets are increasingly difficult to meet the needs of integrated circuit development. Therefore, it is necessary to provide a more novel memory structure and storage system structure.

Figure 1:
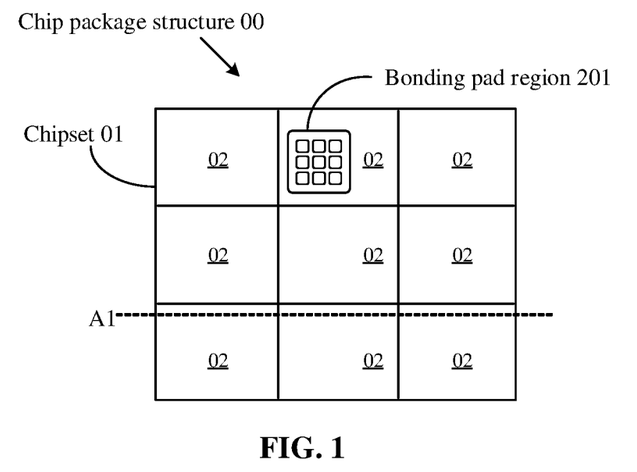
FIG. 1 is a first schematic diagram of a chip package structure according to an embodiment of the disclosure.
Figure 2:
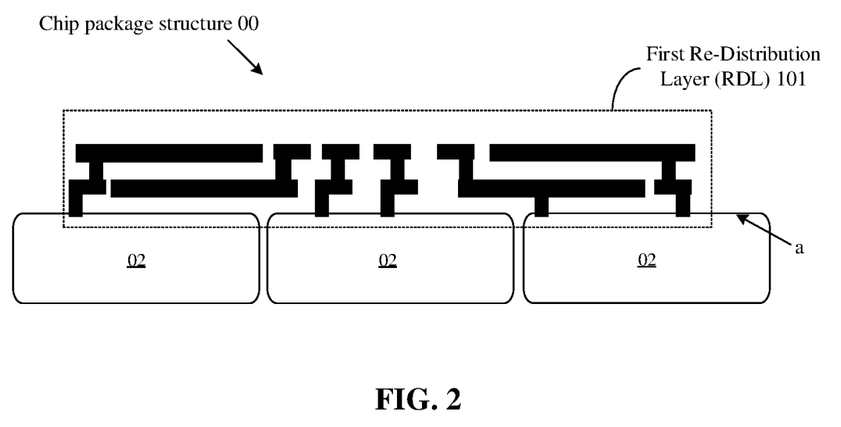
FIG. 2 is a second schematic diagram of a chip package structure according to an embodiment of the disclosure.

FIG. 1 and FIG. 2 are optional structural schematic diagrams of a chip package structure according to an embodiment of the disclosure. FIG. 1 is a top view. As shown in FIG. 1, a chip package structure 00 includes a chipset 01. The chipset 01 includes a plurality of chips 02 distributed horizontally.

FIG. 2 is a cross-sectional view along a cross-sectional line A1 of FIG. 1. With reference to FIGS. 1 and 2, the chip package structure 00 further includes a first Re-Distribution Layer (RDL) 101 disposed on a first surface a of the chipset 01.

Figure 3:
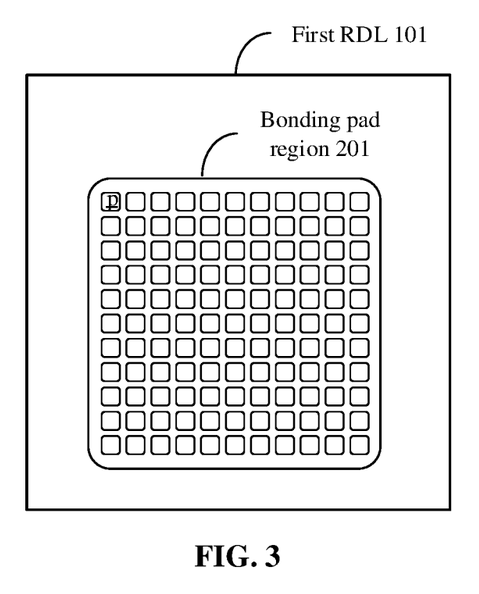
FIG. 3 is a third schematic diagram of a chip package structure according to an embodiment of the disclosure.

With reference to FIGS. 1 and 3, the chip package structure 00 further includes a bonding pad region 201. The bonding pad region 201 includes a plurality of bonding pads p. Herein, the plurality of bonding pads p are located on a side surface of the first RDL 101 away from the chipset, and the plurality of bonding pads p are respectively connected to the plurality of chips 02 through the first RDL 101. The plurality of bonding pads p may be arranged in an array.

In the embodiment of the disclosure, the plurality of bonding pads p are ports of the first RDL 101 and act as external interfaces electrically connected to other modules, and the plurality of bonding pads p satisfy the requirements of Peripheral Component Interface Express (PCIE) and Ethernet. The first RDL 101 may then extend the plurality of bonding pads p and change the layout of the bonding pads p to adapt to the requirements of chip design.

In the embodiment of the disclosure, the first RDL 101 may be obtained by interconnecting a metal interconnection line with a metal plug. Herein, the metal interconnection line is disposed in the horizontal direction, and the metal plug is disposed in the vertical direction.

It is to be understood that the bonding pads p act as external interface electrically connected to other modules to transmit signals. In the embodiments of the disclosure, the bonding pad region 201 is connected to the plurality of chips 02 through the first RDL 101, so that interfaces on the plurality of chips 02 can be connected to the bonding pad region 201 through the RDL, and signals are transmitted to each chip 02 through the bonding pad region 201, thereby achieving centralized transmission of signals. Furthermore, the centralized ports facilitate manufacturing and processing better, reduce the processing difficulty, and also facilitate subsequent bonding connections with other modules.

Figure 4:
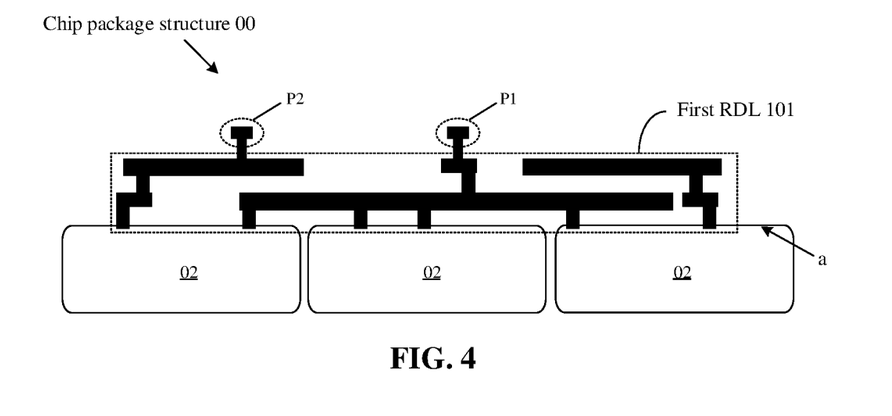
FIG. 4 is a fourth schematic diagram of a chip package structure according to an embodiment of the disclosure.

In some embodiments of the disclosure, the plurality of bonding pads p include a first bonding pad P1 and a second bonding pad P2. As shown in FIG. 4, the first bonding pad P1 is simultaneously connected to at least two of the plurality of chips 02 through the first RDL 101. The second bonding pad P2 is connected to one chip of the plurality of chips 02 through the first RDL 101.

In the embodiment of the disclosure, the horizontal area of the bonding pad region 201 is less than or equal to the total horizontal area of a first surface a of the chipset 01. The bonding pads p are centrally disposed by changing the positions of the bonding pads p, so that the area of the bonding pad region 201 formed can be reduced to facilitate manufacturing and processing, and the bonding accuracy with other modules can be improved.

In some embodiments of the disclosure, the horizontal area of the bonding pad region 201 may be less than or equal to the horizontal area of any of the chips 02. Meanwhile, the orthographic projection of the bonding pad region 201 on the first surface a is within the orthographic projection of one of the plurality of chips 02 on the first surface a. Particularly, the orthographic projection of the bonding pad region 201 on the first surface a may be located in the center of the first surface a. For example, when the chipset 01 includes nine chips 02, the orthographic projection of the bonding pad region 201 on the first surface a may be within the orthographic projection of the chip 02 in the center.

Figure 5:
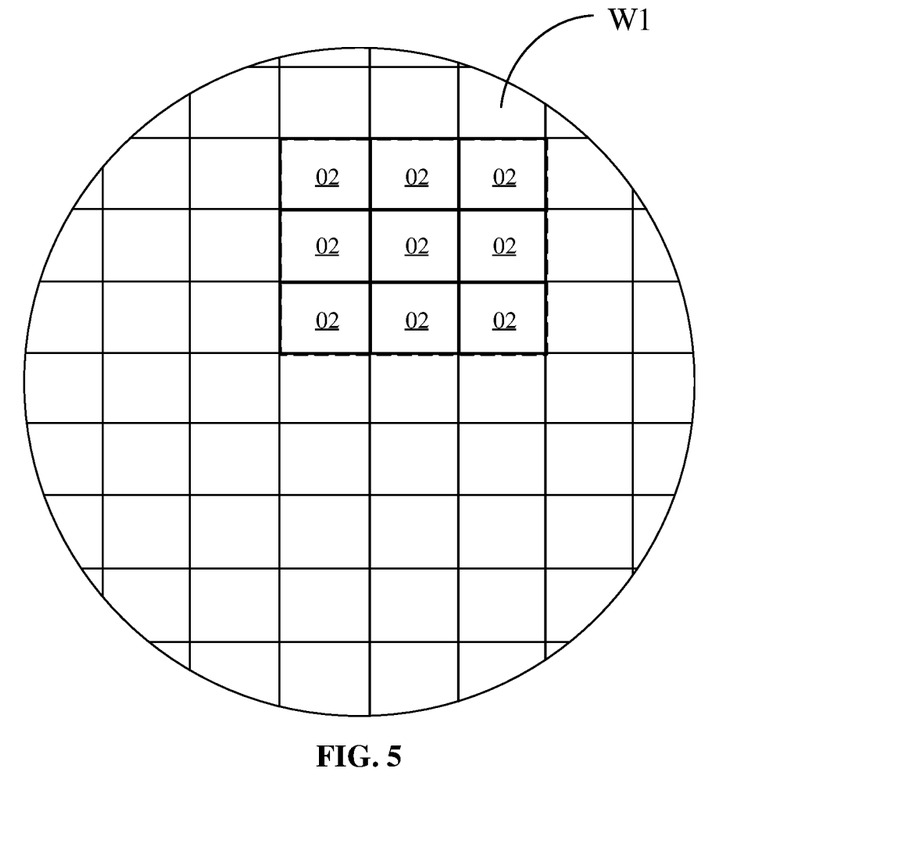
FIG. 5 is a fifth schematic diagram of a chip package structure according to an embodiment of the disclosure.

In the embodiment of the disclosure, the plurality of chips 02 distributed horizontally may be processed on the same wafer. As illustrated in FIG. 5, a wafer W1 includes a plurality of chips 02, and the plurality of chips 02 may be arranged in an array. In a production process of the wafer W1, the plurality of chips 02 may be processed simultaneously.

Figure 6:
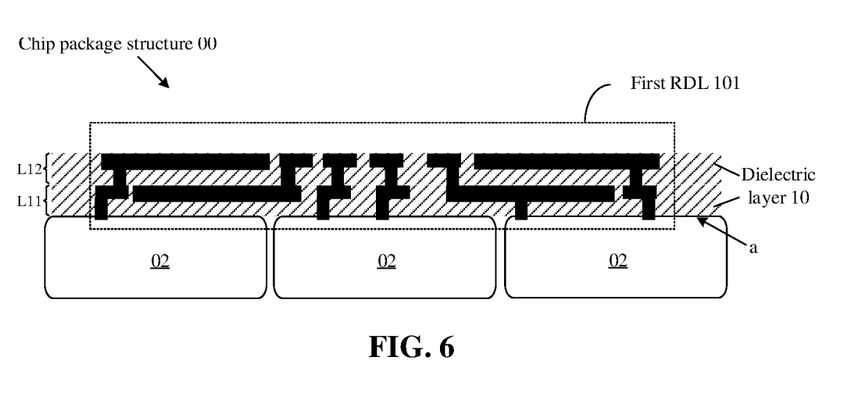
FIG. 6 is sixth a schematic diagram of a chip package structure according to an embodiment of the disclosure.

In the embodiment of the disclosure, as shown in FIG. 6, a dielectric layer 10 is filled outside the first RDL 101. The dielectric layer 10 is configured to support the first RDL 101 and insulate and protect the first RDL 101. The material of the dielectric layer 10 may be Tetra Ethyl Ortho Silicate (TEOS).

In the embodiment of the disclosure, the first RDL 101 may be a multi-layer structure. As illustrated in FIG. 6, the first RDL 101 and the dielectric layer 10 have a two-layer structure, which is an L11 layer and an L12 layer respectively. The multi-layer RDL structure may change the layout of the bonding pads more flexibly to adapt to the requirements of chip design.

It is to be understood that the layout of the bonding pad region 201 can be changed through the first RDL 101, so that different design requirements can be met, and the design diversity is enriched. Furthermore, the plurality of chips 02 may be processed on the same wafer, thus reducing the processing costs and providing more options for chip processing.

Figure 7:
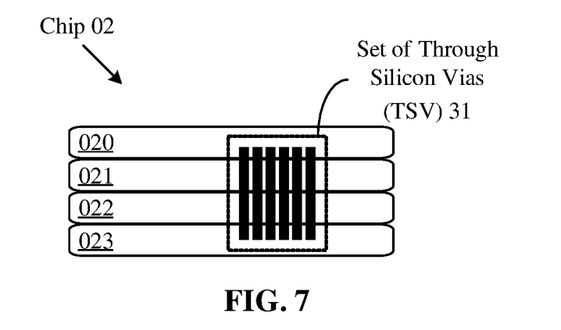
FIG. 7 is a seventh schematic diagram of a chip package structure according to an embodiment of the disclosure.

In some embodiments of the disclosure, as shown in FIG. 7, each of the plurality of chips 02 includes multilayer sub-chips 020, 021, 022 and 023 stacked onto one another vertically. The multilayer sub-chips are interconnected with each other by a set of Through Silicon Vias (TSV) 31. The set of TSVs 31 is configured to transmit signals among the multilayer sub-chips 020, 021, 022, and 023.

It is to be noted that the four-layer sub-chips 020, 021, 022, and 023 shown in FIG. 7 are an optional solution of the embodiment of the disclosure, and the number of layers of the sub-chips in the embodiment of the disclosure may be other values, which are not limited thereto.

In the embodiment of the disclosure, the multilayer sub-chips may include a memory chip, a control chip, or a processor chip. Herein, the memory chip may be a Dynamic Random Access Memory (DRAM) or a Static Random Access Memory (SRAM). That is, a plurality of memory chips, a plurality of control chips, or a plurality of processor chips may be stacked onto one another vertically to form the structure in the embodiment of the disclosure, enabling expansion of the chips in a three-dimensional space. It is to be noted that the TSVs may connect stacked chips with each other to transmit signals and power supply networks for the chips in each wafer.

It is to be understood that the multilayer sub-chips are stacked onto one another vertically and are interconnected with each other through the set of TSVs, such that 3D integration of the chips is implemented, and the degree of integration of the chips in the vertical direction is increased.

In some embodiments of the disclosure, the first RDL 101 includes a plurality of communication buses, a plurality of power buses and a ground bus. Herein, with reference to FIGS. 3 and 4, each communication bus corresponds to and is connected to one of the plurality of chips 02, and the plurality of bonding pads p2 in the bonding pad region 201 respectively transmit communication signals for the plurality of chips 02 through the plurality of communication buses corresponding to the plurality of chips 02. Each power bus corresponds to and is connected to the plurality of chips 02, and one bonding pad p1 in the bonding pad region 201 transmits a power signal for the plurality of chips 02 through one of the plurality of power buses corresponding to the plurality of chips 02. A bonding pad p1 in the bonding pad region 201 connects the plurality of chips 02 to a ground terminal through the ground bus.

Figure 8:
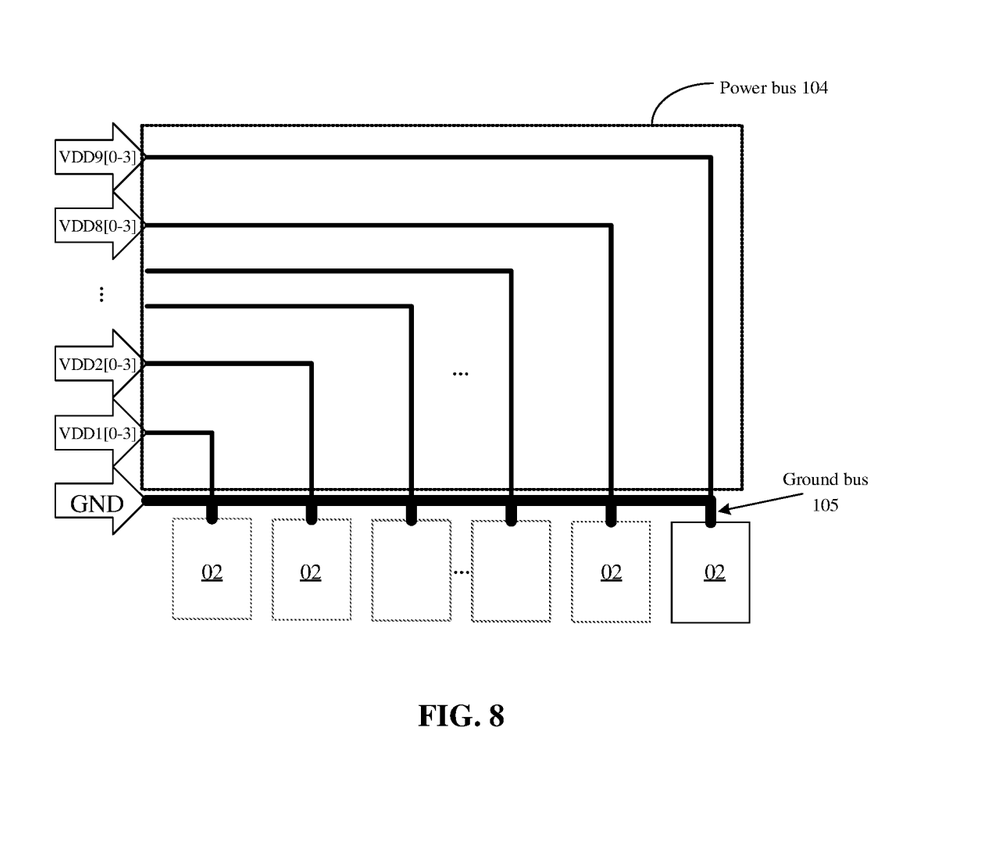
FIG. 8 is an eighth schematic diagram of a chip package structure according to an embodiment of the disclosure.

In the embodiment of the disclosure, FIG. 8 schematically shows a power bus 104 and a ground bus 105. As shown in FIG. 8, a plurality of power buses 104 transmit power signals VDD1-VDD9 for the plurality of chips 02 corresponding to the plurality of power buses 104, and each power bus 104 simultaneously transmits one power signal of VDD1-VDD9 for the plurality of chips 02 respectively. For example, the power signal VDD1 may be transmitted to the plurality of chips 02 through one power bus. Herein, if each chip 02 is composed of multilayer sub-chips stacked onto one another vertically, the power signals VDD1-VDD9 also include power signals corresponding to each layer of sub-chip. Taking 4-layer sub-chips as an example, the power signals VDD1-VDD9 also include sub-power signals corresponding to the 4-layer sub-chips, which are denoted as VDD1[0-3]-VDD9[0-3]. Similarly, the VDD1[0] may be transmitted to interfaces in the plurality of chips 02 for receiving the sub-power supply signal corresponding to a 0-layer sub-chip via one power bus. The ground bus 105 electrically connects the plurality of chips 02 to the ground terminal GND.

In the embodiment of the disclosure, an integrated power management module, such as a Gallium Nitride-Low Dropout linear regulator (GaN LDO), may be employed to transmit power signals.

In some embodiments of the disclosure, a communication bus includes a shared line and a layered line. Herein, the shared line is configured to transmit a communication signal shared by the multilayer sub-chips. The layered line is configured to transmit a communication signal used by each layer of sub-chip of the multilayer sub-chips individually.

In the embodiment of the disclosure, the layered lines form one-to-one correspondence relationship with the multilayer sub-chips. Taking the four-layer sub-chips 020, 021, 022 and 023 shown in FIG. 7 as an example, correspondingly, the layered lines are also divided into four groups, and the four-group layered lines form one-to-one correspondence relationship with the four-layer sub-chips 020, 021, 022 and 023 shown in FIG. 7.

In some embodiments of the disclosure, the communication bus is configured to transmit at least one of a command signal, an address signal, a layer selection signal, or a data signal. Herein, the layered line is configured to transmit the data signal. The shared line is configured to transmit the command signal, the address signal and the layer selection signal.

Figure 9:
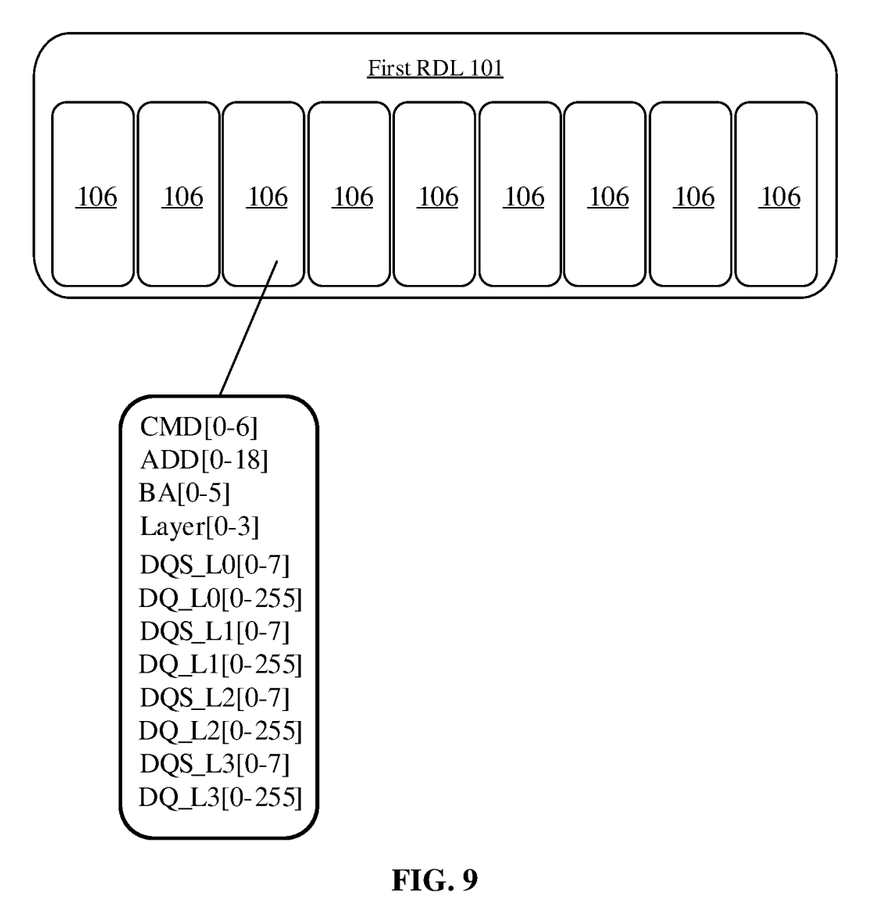
FIG. 9 is a ninth schematic diagram of a chip package structure according to an embodiment of the disclosure.

As shown in FIG. 9, the first RDL 101 includes a plurality of communication buses 106, and the plurality of communication buses 106 form one-to-one correspondence relationship with the plurality of chips 02. The communication signals transmitted in each communication bus 106 include: command signals CMD[0-6], address signals ADD[0-18] and BA[0-5], layer selection signals Layer[0-3], and data signals DQS and DQ. Here, the layer selection signals Layer[0-3] correspond to the 4-layer sub-chips 020, 021, 022, and 023 shown in FIG. 7. Similarly, the data signals DQS and DQ are also divided into DQS_L0[0-7] and DQ_L0[0-255], DQS_L1[0-7] and DQ_L1[0-255], DQS_L2[0-7] and DQ_L2[0-255], and DQS_L3[0-7] and DQ_L3[0-255] according to four layers, respectively.

It is to be understood that, common lines and layered lines corresponding to the multilayer sub-chips are disposed, and communication signals corresponding to each layer of sub-chip are transmitted, so that accurate transmission of the communication signals is achieved, and the risk of transmission errors is reduced.

Figure 10:
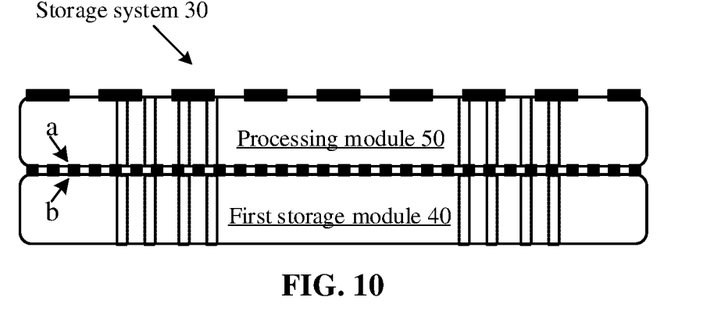
FIG. 10 is a first schematic diagram of a storage system according to an embodiment of the disclosure.

FIG. 10 is an optional schematic diagram of a storage system according to an embodiment of the disclosure. FIG. 10 is a side view, and as shown in FIG. 10, the storage system 30 includes a first storage module 40. The first storage module 40 then includes the chip package structure 00 in the above-described embodiment.

In the embodiment of the disclosure, the first storage module 40 may be implemented with the chip package structure 00 in the embodiment described above. Specifically, the first storage module 40 may include a chipset composed of a plurality of memory chips distributed horizontally. A first RDL is disposed on a first surface of the chipset. A bonding pad region is disposed on the side surface of the first RDL away from the chipset. The bonding pad region includes a plurality of bonding pads and these bonding pads are respectively connected to the plurality of memory chips through the first RDL. Herein, each memory chip in the plurality of memory chips may include multilayer sub-memory chips stacked onto one another vertically. The multilayer sub-memory chips are interconnected with each other via the set of TSVs, and the set of TSVs is configured to transmit signals among the multilayer sub-memory chips. Accordingly, the first RDL may include a plurality of communication buses, a plurality of power buses and a ground bus. The plurality of communication buses may be divided into a shared line and a layered line. The shared line is configured to transmit a communication signal shared by the multilayer sub-memory chips, and the layered line is configured to transmit a communication signal used by each layer of sub-memory chip of the multilayer sub-memory chips individually.

In some embodiments of the disclosure, as shown in FIG. 10, the storage system 30 further includes a processing module 50. The processing module 50 includes a plurality of processor groups distributed horizontally. The processing module 50 is in bonding connection with the first storage module 40. Herein, the first surface a of the processing module 50 faces the second surface b of the first storage module 40.

Figure 11:
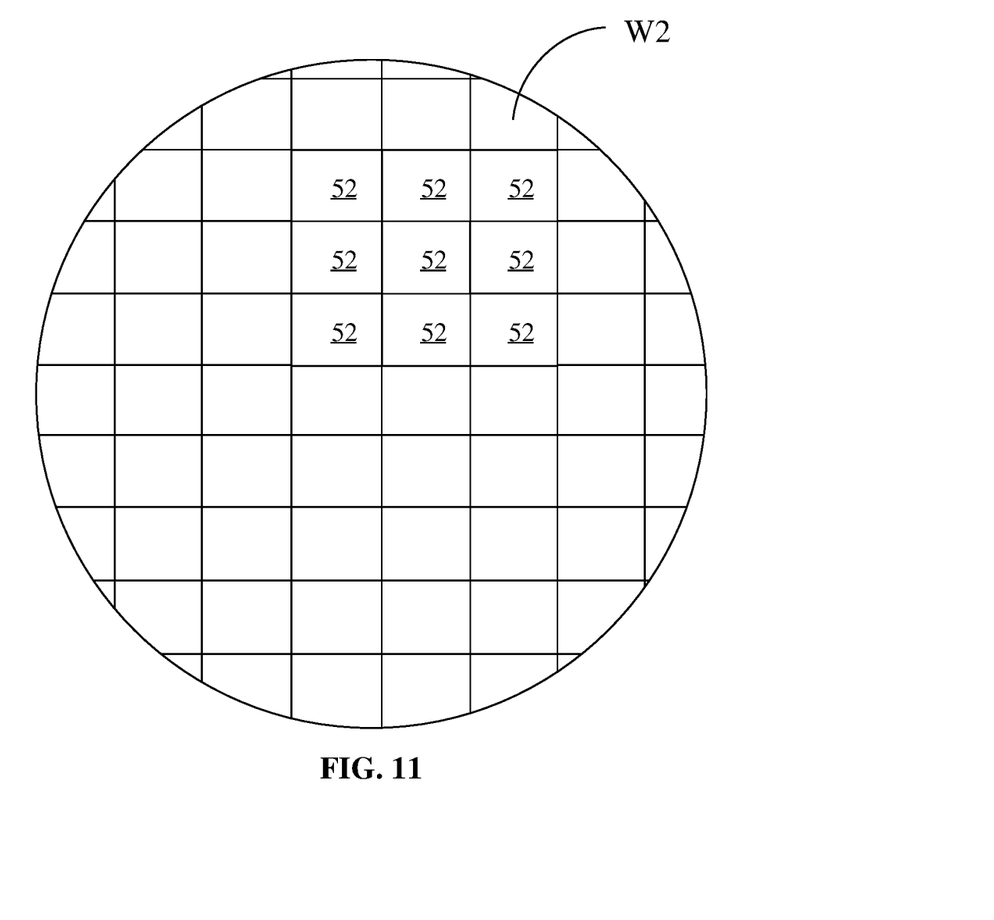
FIG. 11 is a second schematic diagram of a storage system according to an embodiment of the disclosure.

In the embodiment of the disclosure, the processor group may be constituted by processing chips, and the processing chips may include: a Memory Controller chip, a Network chip, a CPU chip, a SRAM chip and a GPU chip. The processing chips may be located on the same substrate. As illustrated in FIG. 11, a plurality of processing chips 52 are located on a Processor wafer W2, and the plurality of processing chips 52 may be arranged in an array. In the production process of wafer W2, the plurality of processing chips 52 may be processed simultaneously.

In the embodiment of the disclosure, the processor group and the first storage module 40 may be bonded together by wafer bonding technology. Herein, the wafer bonding technology may include hybrid bonding, fusion bonding or Cu-pillar Thermal Compression Bond (TCB) bonding.

It is to be understood that the processor group is bonded with the first storage module 40 to form the storage system 30, such that integrated packaging of the processing module with the first storage module is achieved, and the level of integration is improved. Furthermore, the processor group is constituted by processing chips with various functions, which enriches the functions of the processor group.

Figure 12:
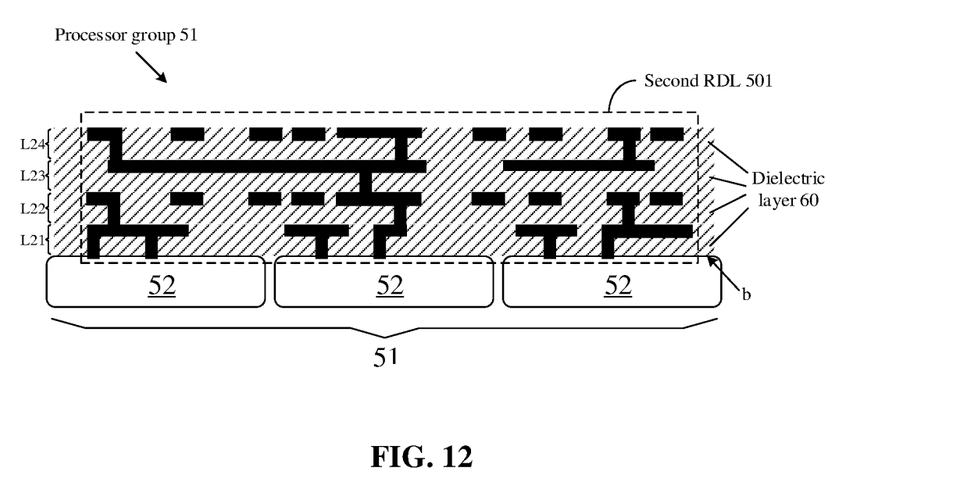
FIG. 12 is a third schematic diagram of a storage system according to an embodiment of the disclosure.

In some embodiments of the disclosure, FIG. 12 is a front sectional view, and as shown in FIG. 12, a second Re-Distribution Layer (RDL) 501 is disposed on the second surface b of the processor group 51, and the second surface b faces the first surface a shown in FIGS. 6 and 10.

In the embodiment of the disclosure, the second RDL 501 may be obtained by interconnecting a metal interconnection line with a metal plug. Herein, the metal interconnection line is disposed in the horizontal direction and the metal plug is disposed in the vertical direction.

As shown in FIG. 12, a dielectric layer 60 is filled outside the second RDL 501. The dielectric layer 60 is configured to support the second RDL 501 and insulate and protect the second RDL 501. The material of the dielectric layer 60 may be TEOS.

In the embodiment of the disclosure, the second RDL 501 may be a multi-layer RDL structure. As illustrated in FIG. 12, the second RDL 501 and the dielectric layer 60 have a four-layer structure, which is an L21 layer, an L22 layer, an L23 layer and an L24 layer respectively. The multi-layer RDL structure may change the layout of the bonding pads more flexibly to adapt to the requirements of chip design.

In the embodiment of the disclosure, the storage system 30 further includes a heat sink for dissipating heat from the first storage module 40 and the processing module 50 in an active state.

It is to be understood that the first RDL 101 is disposed on the first surface a, and the second RDL 501 is disposed on the second surface b opposite to the first surface a. Thus, the processing module 50 may be electrically connected to the first storage module 40 by connecting the first RDL 101 and the second RDL 501 with each other, thereby implementing data transmission.

In some embodiments of the disclosure, a third bonding pad is disposed on a side of the second RDL 501 away from the second surface b. The third bonding pad is bonded to the first bonding pad P1 and the second bonding pad P2 shown in FIG. 4 by a solder ball. A fourth bonding pad is further disposed on the side of the second RDL 501 away from the second surface b, and the fourth bonding pad is configured to be connected to an external lead.

Figure 13:
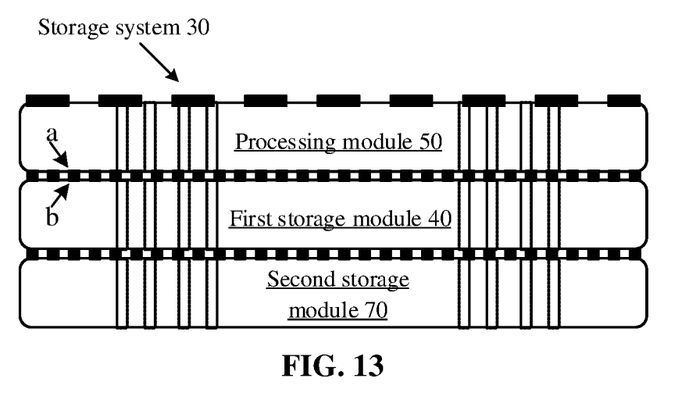
FIG. 13 is a fourth schematic diagram of a storage system according to an embodiment of the disclosure.

In some embodiments of the disclosure, as shown in FIG. 13, the storage system 30 further includes a second storage module 70. Herein, the first surface a of the processing module 50 faces the second surface b of the first storage module 40, and the second storage module 70 is in bonding connection with a side surface of the first storage module 40 away from the processing module 50.

In the embodiments of the disclosure, the chip in the first storage module 40 may be set as DRAM, and the chip in the second storage module 70 may be set as SRAM. Thus, the storage capacity and storage manner of the storage system 30 for data are enriched.

It is to be noted that terms "include" and "contain" or any other variant thereof is intended to cover nonexclusive inclusions herein, so that a process, method, object or device including a series of elements not only includes those elements but also includes other elements which are not clearly listed or further includes elements intrinsic to the process, the method, the object or the device. Without further restrictions, the element defined by the statement "including a . . . " does not exclude the existence of another same element in the process, method, article or device including the element.

The sequence numbers of the embodiments of the disclosure are adopted not to represent superiority-inferiority of the embodiments but only for description. The methods disclosed in several method embodiments provided in the present disclosure may be arbitrarily combined without conflict to obtain a new method embodiment. The characteristics disclosed in a plurality of product embodiments provided in the present disclosure may be arbitrarily combined without conflict to obtain a new product embodiment. The characteristics disclosed in the several method or device embodiments provided in the present disclosure may be arbitrarily combined without conflict to obtain a new method embodiment or device embodiment.

The above is only the specific implementation mode of the present disclosure and not intended to limit the scope of protection of the present disclosure. Any variations or replacements apparent to those skilled in the art within the technical scope disclosed by the present disclosure shall fall within the scope of protection of the present disclosure. Therefore, the scope of protection of the disclosure shall be subject to the scope of protection of the claims.

The invention claimed is:

1. A chip package structure, comprising:
a chipset, wherein the chipset comprises a plurality of chips distributed horizontally;
a first Re-Distribution Layer (RDL) disposed on a first surface of the chipset; and
a bonding pad region, wherein the bonding pad region comprises a plurality of bonding pads, the plurality of bonding pads are located on a side surface of the first RDL away from the chipset, and the plurality of bonding pads are connected to the plurality of chips through the first RDL; wherein all bonding pads corresponding to the plurality of chips are centrally disposed in the bonding pad region;
wherein a horizontal area of the bonding pad region is less than or equal to a total horizontal area of the first surface of the chipset;
the horizontal area of the bonding pad region is less than or equal to a horizontal area of any one of the plurality of chips, and
an orthographic projection of the bonding pad region on the first surface is within an orthographic projection of one of the plurality of chips on the first surface.

2. The chip package structure of claim 1, wherein the plurality of bonding pads comprise a first bonding pad and a second bonding pad,
the first bonding pad is simultaneously connected to at least two of the plurality of chips through the first RDL, and
the second bonding pad is connected to one of the plurality of chips through the first RDL.

3. The chip package structure of claim 1, wherein
the orthographic projection of the bonding pad region on the first surface is located in a center of the first surface.

4. The chip package structure of claim 1, wherein
each of the plurality of chips comprises multilayer sub-chips stacked onto one another vertically, and the multilayer sub-chips are interconnected with each other by a set of Through Silicon Vias (TSV).

5. The chip package structure of claim 4, wherein each of the multilayer sub-chips comprises a memory chip, a control chip or a processor chip.

6. The chip package structure of claim 1, wherein the first RDL comprises a plurality of communication buses, a plurality of power buses and a ground bus,
wherein each communication bus corresponds to and is connected to one of the plurality of chips, and the plurality of bonding pads respectively transmit communication signals for the plurality of chips through the plurality of communication buses corresponding to the plurality of chips, each power bus corresponds to and is connected to the plurality of chips, and one of the plurality of bonding pads transmits a power signal for the plurality of chips through one of the plurality of power buses corresponding to the plurality of chips, and one of the plurality of bonding pads connects the plurality of chips to a ground terminal through the ground bus.

7. The chip package structure of claim 6, wherein the plurality of communication buses comprise a shared line and a layered line, the shared line is configured to transmit a communication signal shared by the multilayer sub-chips, and the layered line is configured to transmit a communication signal used by each layer of sub-chip of the multilayer sub-chips individually.

8. The chip package structure of claim 7, wherein the plurality of communication buses are configured to transmit at least one of a command signal, an address signal, a layer selection signal, or a data signal.

9. The chip package structure of claim 8, wherein the layered line is configured to transmit the data signal, the shared line is configured to transmit the command signal, the address signal and the layer selection signal.

10. A storage system, comprising: a first storage module, wherein the first storage module comprises the chip package structure according to claim 1.

11. The storage system of claim 10, further comprising a processing module, wherein the processing module comprises a plurality of processor groups distributed horizontally, and the processing module is in bonding connection with the first storage module.

12. The storage system of claim 11, wherein a second Re-Distribution Layer (RDL) is disposed on a second surface of the processor groups, wherein the second surface face the first surface.

13. The storage system of claim 12, wherein each of the first RDL and the second RDL is obtained by connecting a metal interconnection line with a metal plug, each of the first RDL and the second RDL is filled with a dielectric layer.

14. The storage system of claim 12, wherein a third bonding pad is disposed on a side of the second RDL away from the second surface, the third bonding pad is bonded to the first bonding pad and the second bonding pad by a solder ball.

15. The storage system of claim 11, further comprising a second storage module, wherein the second storage module is in bonding connection with a side surface of the first storage module away from the processing module.

* * * * *